United States Patent
Matsumoto

(10) Patent No.: US 9,218,942 B2
(45) Date of Patent: Dec. 22, 2015

(54) CHARGED PARTICLE BEAM WRITING APPARATUS AND CHARGED PARTICLE BEAM WRITING METHOD

(75) Inventor: Hironobu Matsumoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 120 days.

(21) Appl. No.: 13/253,382

(22) Filed: Oct. 5, 2011

(65) Prior Publication Data
US 2012/0085940 A1    Apr. 12, 2012

(30) Foreign Application Priority Data
Oct. 8, 2010    (JP) .................................. 2010-228714

(51) Int. Cl.
H01J 37/302    (2006.01)
H01J 37/317    (2006.01)
B82Y 10/00    (2011.01)
B82Y 40/00    (2011.01)

(52) U.S. Cl.
CPC ............. *H01J 37/3174* (2013.01); *B82Y 10/00* (2013.01); *B82Y 40/00* (2013.01); *H01J 37/3026* (2013.01); *H01J 2237/31764* (2013.01); *H01J 2237/31776* (2013.01)

(58) Field of Classification Search
CPC ............. H01J 37/3026; H01J 37/3174; H01J 2237/31723; H01J 2237/31761; H01J 2237/31764
USPC ........................................... 250/492.1–492.3
See application file for complete search history.

(56) References Cited

U.S. PATENT DOCUMENTS

| 5,760,410 | A  | * | 6/1998 | Matsuki et al. | ........... 250/492.22 |
| 7,485,879 | B2 | * | 2/2009 | Sunaoshi et al. | ......... 250/492.22 |
| 2005/0053850 | A1 | * | 3/2005 | Askebjer et al. | .................. 430/5 |
| 2005/0084766 | A1 | * | 4/2005 | Sandstrom | ........................ 430/5 |
| 2007/0023703 | A1 | * | 2/2007 | Sunaoshi et al. | ......... 250/492.22 |
| 2010/0072390 | A1 | * | 3/2010 | Yashima | ................... 250/396 R |

(Continued)

FOREIGN PATENT DOCUMENTS

| JP | 2003-059794 A | 2/2003 |
| JP | 2003-100582   | 4/2003 |

(Continued)

OTHER PUBLICATIONS

U.S. Appl. No. 13/669,716, filed Nov. 6, 2012, Matsumoto.

(Continued)

*Primary Examiner* — Robert Kim
*Assistant Examiner* — Eliza Osenbaugh-Stewar
(74) *Attorney, Agent, or Firm* — Oblon, McClelland, Maier & Neustadt, L.L.P.

(57) ABSTRACT

A charged particle beam writing apparatus includes a shot division unit configured to divide a figure defined in layout data into a plurality of shot figures each having a size which can be irradiated by one shot of a charged particle beam, a shot data generating unit configured to generate each shot data for each shot figure of the plurality of shot figures, where a number of times of generating the each shot data equals a number of times of multiple writing of the each shot figure of the plurality of shot figures, such that multiplicity of the multiple writing is variable per the each shot figure, and a writing unit configured to perform the multiple writing of the each shot figure onto a target workpiece, in accordance with the number of times of the each shot data generated for the each shot figure, using a charged particle beam.

8 Claims, 13 Drawing Sheets

(56) References Cited

U.S. PATENT DOCUMENTS

2010/0183963 A1* 7/2010 Zable et al. ............... 430/30
2011/0165502 A1* 7/2011 Caldwell et al. ............ 430/5
2011/0253912 A1   10/2011 Matsumoto

FOREIGN PATENT DOCUMENTS

| | | |
|---|---|---|
| JP | 2003-289039 A | 10/2003 |
| JP | 2007-157742 | 6/2007 |
| JP | 2008-117871 | 5/2008 |
| JP | 2010-267723 | 11/2010 |

OTHER PUBLICATIONS

U.S. Appl. No. 13/961,101, filed Aug. 7, 2013, Matsumoto.
Office Action issued Apr. 15, 2014 in Japanese Patent Application No. 2010-228714 filed Oct. 8, 2010 (with English Translation).
U.S. Appl. No. 14/278,177, filed May 15, 2014, Matsumoto.

* cited by examiner

First Layer, First And Second Columns

Second Layer, First And Second Columns

First Layer
First And Second Columns
First Time

First Layer
First And Second Columns
Second Time

First Layer
First And Second Columns
Third Time

First Layer
First And Second Columns
Fourth Time

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2010-228714 filed on Oct. 8, 2010 in Japan, the entire contents of which are incorporated herein by reference.

BACKGROUND OF THE INVENTION

1. Field of the Invention

The present invention relates to a charged particle beam writing apparatus and a charged particle beam writing method. For example, it relates to a writing apparatus and a writing method used when performing multiple writing with an electron beam.

2. Description of Related Art

The microlithography technique which advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

FIG. 14 is a schematic diagram for explaining operations of a variable-shaped electron beam (EB) writing apparatus. As shown in the figure, the variable-shaped electron beam writing apparatus operates as described below. A first aperture plate 410 has a quadrangular, such as a rectangular, opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 410, and thereby to irradiate a target workpiece or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing area of the target workpiece 340 on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

In the electron beam writing, it is expected to shorten a writing time. For shortening a writing time, there is a method of writing with a beam of high current density. However, if a beam of high current density irradiates a resist-applied mask, a problem referred to as "resist heating" may occur that the temperature of the resist raises and dimensions different from desired ones are formed. Furthermore, if the temperature of the resist raises to exceed a resist melting point, a problem may also occur that the resist evaporates and disperses to pollute the inside of the writing chamber. Therefore, in the electron beam writing, a dose per shot of a figure to be written is reduced by employing a multiple writing system that overlappingly writes a writing pattern a plurality of times. Thereby, the temperature raise of resist is diminished. With regard to the multiple writing system, there are some methods proposed: one is that the first writing and the second writing are performed per stripe area made by virtually dividing a chip area or a writing group area composed of a plurality of chips under the same writing conditions, and another is that the writing operation is advanced while alternately performing the first writing and the second writing per subfield in a stripe area (refer to e.g., Japanese Patent Application Laid-open (JP-A) No. 2008-117871).

When performing writing of figures to be written, since a proximity effect etc is corrected by a dose modulation method, the suitable dose varies depending upon a figure to be written. Conventionally, treating a maximum dose in doses necessary for writing figures in a chip area or a writing group area as a reference dose, writing of the entire chip area or writing group area is performed with a multiplicity capable of obtaining the maximum dose. Therefore, depending on a figure written, there is a case of performing multiple writing too many times than needed. Thus, there has been a problem that the writing time is prolonged by the number of times of such an excessive multiple writing.

In the current tendency of expecting to shorten the writing time, if there exists a figure for which too many times of multiple writing than needed is performed, as described above, thereby causing a problem that writing time is prolonged by the number of excessive shots for the figure.

BRIEF SUMMARY OF THE INVENTION

In accordance with one aspect of the present invention, a charged particle beam writing apparatus includes a shot division unit configured to divide a figure defined in layout data into a plurality of shot figures each having a size which can be irradiated by one shot of a charged particle beam, a shot data generating unit configured to generate each shot data for each shot figure of the plurality of shot figures, where a number of times of generating the each shot data is equivalent to a number of times of multiple writing of the each shot figure of the plurality of shot figures, such that multiplicity of the multiple writing is variable per the each shot figure, and a writing unit configured to perform the multiple writing of the each shot figure onto a target workpiece, in accordance with the number of times of the each shot data generated for the each shot figure, using a charged particle beam.

In accordance with another aspect of the present invention, a charged particle beam writing method includes dividing a figure defined in layout data into a plurality of shot figures each having a size which can be irradiated by one shot of a charged particle beam, generating each shot data for each shot figure of the plurality of shot figures, where a number of times of generating the each shot data is equivalent to a number of times of multiple writing of the each shot figure of the plurality of shot figures, such that multiplicity of the multiple writing is variable per the each shot figure, and performing the multiple writing of the each shot figure onto a target workpiece, in accordance with the number of times of the each shot data generated for the each shot figure, using a charged particle beam.

BRIEF DESCRIPTION OF THE DRAWINGS

FIGS. 10A to 10E show an example of a writing order of an SF layer according to Embodiment 1;

DETAILED DESCRIPTION OF THE INVENTION

Embodiment 1

In the following embodiments, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

In the following Embodiments, there will be described an apparatus and a method capable of reducing writing time when performing multiple writing.

In the electron beam writing, the accuracy of connecting patterns between adjacent stripe areas can be improved by performing multiple writing of each of a plurality of stripe areas made by virtually dividing a writing area of a target workpiece into strip-like areas each having a predetermined width, while shifting the position of a stripe by the size smaller than or equal to an subfield (SF) size. Thus, by means of sifting the position of a stripe, even in a plurality of SFs made by virtually dividing a writing area into mesh like areas each being smaller than the width of the stripe area, it is possible to improve the accuracy of connecting patterns between adjacent SF areas. Therefore, in the Embodiments described below, explanation will be given on the assumption that multiple writing is performed per stripe area while shifting the position. In such a case, for example, every time when a stripe area is written, all the SF areas in the stripe area are written, and this operation is repeated a preset number of times of multiple writing for each stripe area. Alternatively, it is also acceptable to implement a configuration such that an SF group (SFG) is composed of a plurality of SFs, and when writing each of SF layers of the number of times of multiple writing per stripe area, the writing is alternately repeated per SFG. However, here, in the multiple writing per stripe area, the number of times of multiple writing (multiplicity) is set such that a dose used in the multiple writing with a preset multiplicity is to be less than or equal to a dose suitable for each figure. Then, with regard to an insufficient dose, it can be adjusted and obtained by further repeatedly writing an SF or an SFG composed of a plurality of SFs when writing each of SF layers per stripe area. In the Embodiments described below, the multiplicity is made to be variable for each shot figure by making the number of times to repeat such an adjustment be variable for each shot figure. However, it is not limited thereto, and multiple writing may be performed per SF or per shot figure instead of per stripe area described above.

Figure 1:
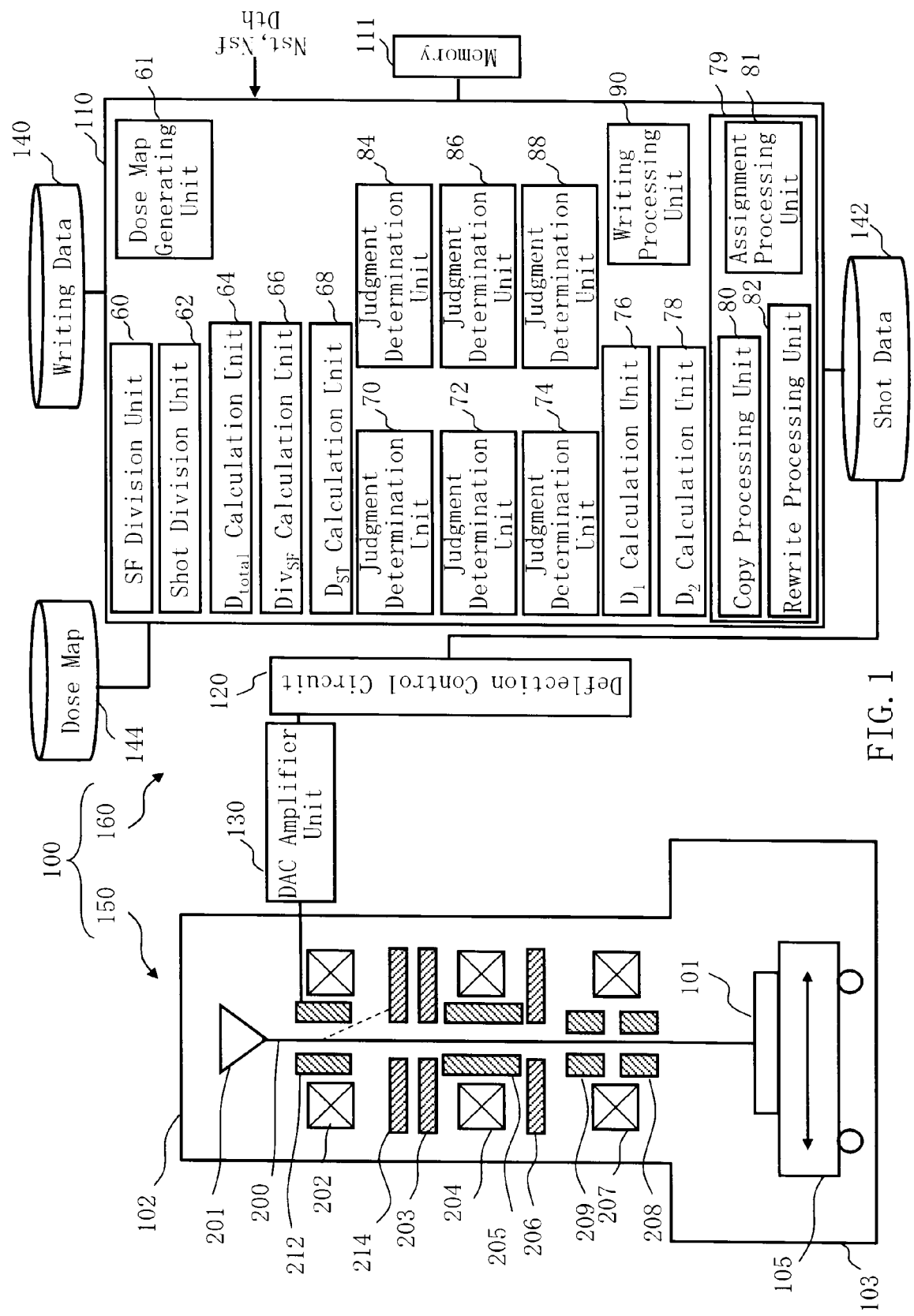
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector (blanker) 212, a blanking aperture 214, a first shaping aperture 203, a projection lens 204, a deflector 205, a second shaping aperture 206, an objective lens 207, a main deflector 208, and a sub deflector 209. In the writing chamber 103, there is arranged an XY stage 105 that is movable at least in the XY direction. On the XY stage 105, there is placed a target workpiece 101 serving as a writing target to which resist is applied. The target workpiece 101 is, for example, a mask for exposure, a silicon wafer, etc. used for manufacturing semiconductor devices. The mask is, for example, a mask blank where no patterns are formed.

The control unit 160 includes a control computer 110, a memory 111, a deflection control circuit 120, a DAC (digital analog converter) amplifier unit 130 (deflection amplifier), and storage devices 140, 142, and 144 (examples of a storage unit) such as a magnetic disk drive. The control computer 110, the memory 111, the deflection control circuit 120, and the storage devices 140, 142 and 144 are mutually connected through a bus (not shown). The deflection control circuit 120 is connected to the DAC amplifier unit 130, and this unit 130 is connected to the blanking deflector 212.

A digital signal for blanking control is output from the deflection control circuit 120 to the DAC amplifier unit 130. The DAC amplifier unit 130 converts the digital signal to an analog signal and amplifies it to be applied as a deflection voltage to the blanking deflector 212. The electron beam 200 is deflected by the deflection voltage so to form each beam shot.

Moreover, in the control calculator 110, there are arranged a subfield (SF) division unit 60, a dose map generating unit 61, a shot division unit 62, a total dose calculation unit 64, a beam irradiation dividing number calculation unit 66, a temporary dose calculation unit 68, judgment determination units 70, 72, 74, 84, 86, and 88, a shot dose calculation unit 76, a residual dose calculation unit 78, a shot data generating unit 79 and a writing processing unit 90. The shot data generating unit 79 includes a copy processing unit 80, an assignment processing unit 81, and a rewrite processing unit 82. Each function of the SF division unit 60, the total dose calculation unit 64, the beam irradiation dividing number calculation unit 66, the temporary dose calculation unit 68, the judgment determination units 70, 72, 74, 84, 86, and 88, the shot dose calculation unit 76, the residual dose calculation unit 78, the shot data generating unit 79, and the writing processing unit 90 may be configured by software such as a program, or may be configured by hardware such as an electronic circuit. Alternatively, it may be configured by a combination of software and hardware. Input data to be necessary in the control computer unit 110 and a calculated result are stored in the memory 111 each time. Similarly, each function of the copy processing unit 80, the assignment processing unit 81, and the rewrite processing unit 82 may be configured by software such as a program, or may be configured by hardware such as an electronic circuit. Alternatively, it may be configured by a combination of software and hardware. Input data to be necessary in the control computer unit 110 and a calculated result are stored in the memory 111 each time.

Moreover, writing data is input from the outside and stored in the storage device 140.

FIG. 1 shows a structure necessary for describing Embodiment 1. Other structure elements generally necessary for the writing apparatus 100 may also be included.

Figure 2:
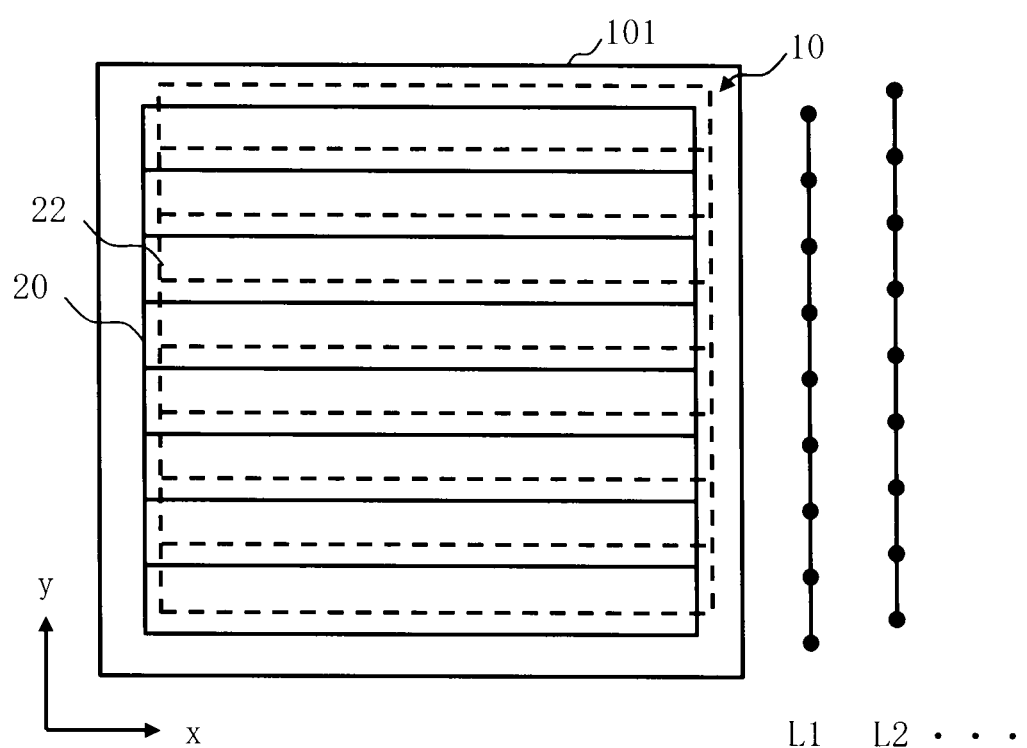
FIG. 2 is a schematic diagram for explaining a writing procedure according to Embodiment 1.

FIG. 2 is a schematic diagram for explaining a writing procedure according to Embodiment 1. In the writing apparatus 100, the writing area of the target workpiece 101 is virtually divided into a plurality of striped areas 20 and 22. FIG. 2 illustrates, for example, the case where one chip shown as a chip area 10 (an example of the writing area) is written on the target workpiece 101. Needless to say, it may be the case where a plurality of chips are written on the target workpiece 101. The width of each of the stripe areas 20 and 22 is divided into a width deflectable by the main deflector 208, or a width a little narrower than that. As an example, here is described the case where the number of times (multiplicity) of multiple writing per stripe area is 2. A stripe layer (layer) is structured at each time of the multiple writing per stripe area. Then, there are formed a stripe layer (layer) for the first writing composed of stripe areas 20 and another stripe layer (layer) for the second writing composed of stripe areas 22. That is, the number of stripe layers is two in this case. In multiple writing, there is a case of shifting the stripe areas 20 and 22 a little in a time between the first writing and the second writing. In the case of FIG. 2, the stripe area 20 for the first writing and the stripe area 22 for the second writing are shown. By making the amount of shifting of a stripe smaller than the SF size, the accuracy of connecting patterns can also be improved between stripe areas and between SFs in the stripe area. When performing writing to the target workpiece 101, the XY stage 105 is continuously moved in the x direction, for example. Thus, during the continuous movement, the electron beam 200 irradiates one of the stripe areas 20 (one of the stripe areas 22). The XY stage 105 is continuously moved in the X direction, and simultaneously, the shot position of the electron beam 200 is made to follow up the stage movement by the main deflector 208. It is possible to shorten the writing time by making a continuous movement. Moreover, it is further preferable to reduce the writing time by making the XY stage 105 move in a variable speed, such as a relatively low writable speed in a high pattern density area and a relatively high writable speed in a low pattern density area. After writing one of the stripe areas 20 (one of the stripe areas 22), the XY stage 105 is moved in the y direction by step feeding, and then writing operation is performed in the x direction (e.g., reverse direction, this time) for the next one of the stripe areas 20 (the next one of the stripe areas 22). By performing the writing operation in a zigzag manner respectively for each stripe area 20 and each stripe area 22, the movement time of the XY stage 105 can be shortened.

Figure 3:
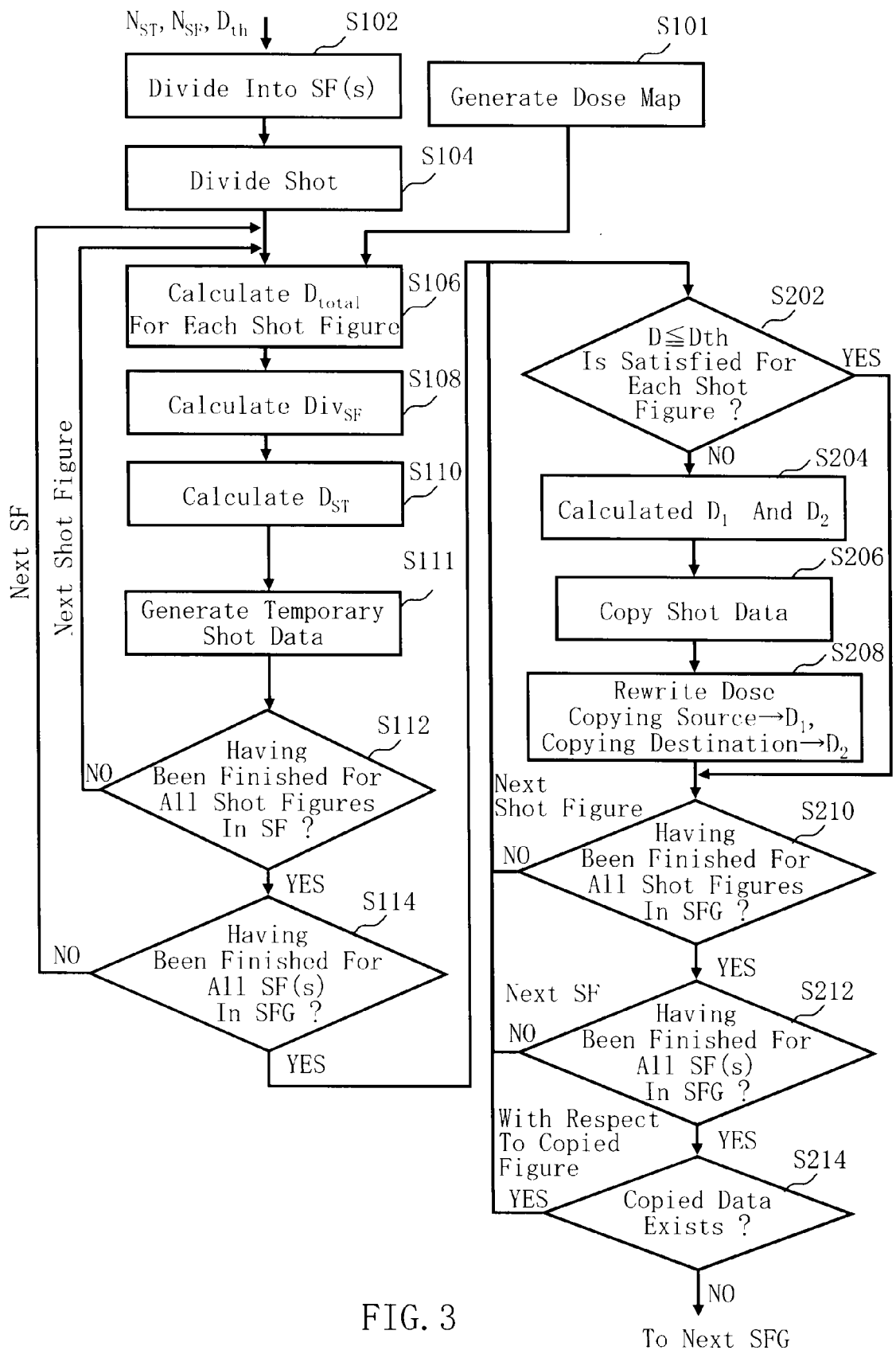
FIG. 3 is a flowchart showing main steps of a writing method according to Embodiment 1.

FIG. 3 is a flowchart showing main steps of a writing method according to Embodiment 1. In FIG. 3, the writing method of Embodiment 1 executes a series of steps: a dose map generating step (S101), an SF division step (S102), a shot division step (S104), a total dose calculation step (S106), a beam irradiation dividing number calculation step (S108), a temporary dose calculation step (S110), a temporary shot data generating step (S111), a judgment determination step (S112), a judgment determination step (S114), a judgment determination step (S202), a shot dose & residual dose calculation step (S204), a copy step (S206), a rewrite step (S208), a judgment determination step (S210), a judgment determination step (S212), and a judgment determination step (S214).

In the dose map generating step (S101), the dose map generating unit 61 reads writing data of the layout from the storage device 140, and calculates a suitable dose for each of a plurality of mesh areas made by virtually dividing the writing area into mesh-like areas of a predetermined size. Then, a dose map corresponding to coordinates of each mesh area is created. The dose map 40 is stored in the storage device 144.

Figure 4:
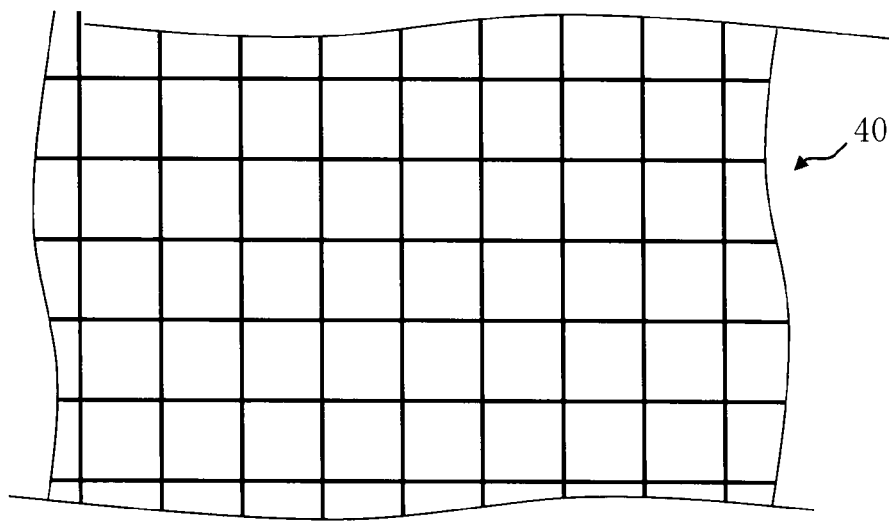
FIG. 4 is a schematic diagram showing an example of a dose map according to Embodiment 1.

FIG. 4 is a schematic diagram showing an example of a dose map according to Embodiment 1. In FIG. 4, each mesh defined in the dose map 40 is set a dose corresponding to its coordinates. For example, in the electron beam writing, dimensional variation occurs due to a phenomenon, such as proximity effect or fogging effect. Therefore, a dose for correcting the dimensional variation is calculated for each mesh area. As a result, suitable doses differ from each other according to a mesh area. It is preferable for a mesh size to be, for example, about several times of a maximum shot size. For example, when the maximum shot size is 0.5 μms, preferably, the mesh size is to be about 1.5 μms. However, it is not limited thereto, and the mesh size may be smaller than this size. For example, it may be about 1/10 of the influence range of the proximity effect, and specifically, may be about 1 μm.

In the SF division step (S102), the SF division unit 60 divides the writing area of the target workpiece 101 into a plurality of mesh-like subfield (SF) areas for the first writing of multiple writing, and newly, divides the writing area of the target workpiece 101 into a plurality of mesh-like subfield (SF) areas for the second writing of multiple writing.

Figure 5:
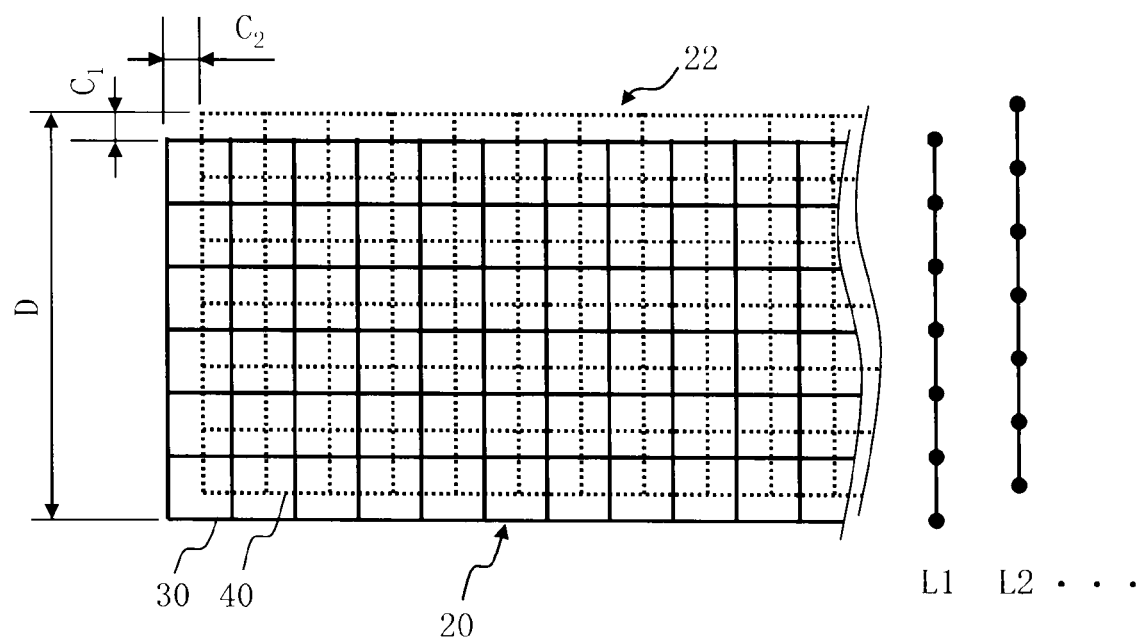
FIG. 5 is a schematic diagram for explaining an SF layer according to Embodiment 1.

FIG. 5 is a schematic diagram for explaining an SF layer according to Embodiment 1. FIG. 5 shows the case of two SF layers (SF layer number $N_{SF}=2$) as an example. Since the writing operation is advanced for each stripe area 20, an SF layer for the first writing, which is composed of a plurality of mesh-like SF areas 30, is formed in each stripe area 20 for the first writing. Similarly, an SF layer for the second writing, which is composed of a plurality of SF areas 32, is formed in each stripe area 22 for the second writing. In the case of FIG. 5, the SF layer for the first writing and the SF layer for the second writing are arranged shifted from each other by c1 being smaller than the SF size in the y direction and by c2 being smaller than the SF size in the x direction. For example, in the case of two times writing per stripe area (that is, multiplicity N=2 for each stripe area), they are shifted from each other by ½ of the SF size respectively in the x direction and the y direction. By performing such shifting, accuracy of connecting patterns can also be improved between stripe areas and between SFs in the stripe area. It is structured such that the dividing width (dividing height) in the y direction of each of the stripe areas 20 and 22 is smaller than a main deflection width D which is deflectable by the main deflector 208. Preferably, the stripe area 20 for the first writing and the stripe area 22 for the second writing, which are arranged shifted from each other, are within a deflectable range.

In the shot division step (S104), the shot division unit 62 divides each figure defined in writing data (layout data) into a plurality of shot figures each having a size which can be irradiated by one shot of the electron beam 200. In other words, each figure defined in writing data is divided into a plurality of shot figures each having a size smaller than or equal to a maximum shot size. A shot figure is formed of a type which can be shaped by the first shaping aperture 203 and the second shaping aperture 206. For example, it is shaped to a quadrangle, such as a square and a rectangle, an isosceles right angle, etc. Moreover, the maximum shot size is set to be a size which can be shaped by the first shaping aperture 203 and the second shaping aperture 206.

In the total dose calculation step (S106), the total dose calculation unit 64 reads the dose map 40 from the storage device 144, and calculates a total dose $D_{total}$ for each shot figure, which is used when performing multiple writing of a shot figure concerned. The total dose $D_{total}$ is calculated using a dose defined for each mesh in the dose map 40 in which the shot figure is located. In addition, it is more preferable to make a calculation using a dose defined for each mesh in the dose map 40 for the surroundings of the shot figure center. For example, it is preferable to regard the center of a rectangle (or square) bound the shot figure as the shot figure center.

Figure 6:
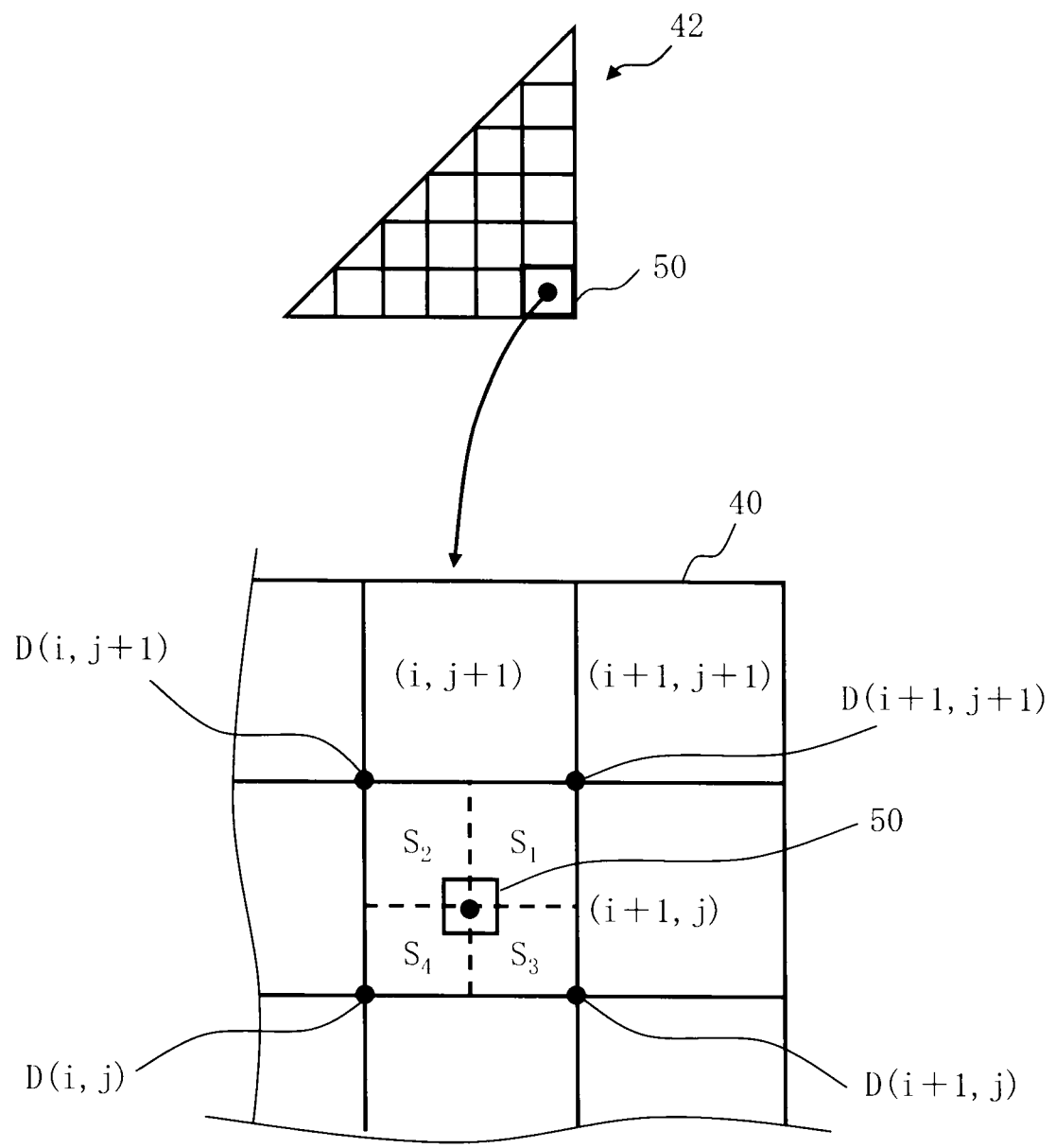
FIG. 6 is a schematic diagram for explaining an example of a method of calculating a total dose of a shot figure according to Embodiment 1.

FIG. 6 is a schematic diagram for explaining an example of a method of calculating a total dose $D_{total}$ of a shot figure according to Embodiment 1. FIG. 6 shows a case of shot dividing where a figure 42 is divided into a plurality of shot figure 50. The case in which the shot figure 50 is located in the mesh area of coordinates (i,j) of the dose map 40 will be explained as an example. The dose D specified for each mesh area of the dose map 40 is defined by the reference position of each mesh area, such as the position of the lower left corner. In other words, the dose D(i,j) specified for the mesh area of the coordinates (i,j) is defined by the reference position of the mesh area of the coordinates (i,j), that is, for example, the position of the lower left corner. Moreover, the dose D(i+1,j) specified for the mesh area of coordinates (i+1,j) is defined by the reference position of the mesh area of the coordinates (i+1,j), that is, for example, the position of the lower left corner. Further, the dose D(i,j+1) specified for the mesh area of coordinates (i,j+1) is defined by the reference position of the mesh area of the coordinates (i,j+1), that is, for example, the position of the lower left corner. Furthermore, the dose D(i+1,j+1) specified for the mesh area of coordinates (i+1,j+1) is defined by the reference position of the mesh area of the coordinates (i+1,j+1), that is for example, the position of the lower left corner.

Accordingly, the shot figure 50 is surrounded by the reference position of the mesh area of the coordinates (i,j), the reference position of the adjacent mesh area of the coordinates (i+1,j), the reference position of the adjacent mesh area of the coordinates (i,j+1), and the reference position of the adjacent mesh area of the coordinates (i+1,j+1). The mesh area of the coordinates (i,j) can be divided into four rectangles, whose area ratios are indicated by $S_1$ to $S_4$, by parting lines in the directions of x and y that go through the center O of the shot figure 50. The area ratio of the rectangle whose opposing corners are the reference position of the mesh area of the coordinates (i+1,j+1) and the center O of the shot figure 50 is defined to be $S_1$. The area ratio of the rectangle whose opposing corners are the reference position of the mesh area of the coordinates (i,j+1) and the center O of the shot figure 50 is defined to be $S_2$. The area ratio of the rectangle whose opposing corners are the reference position of the mesh area of the coordinates (i+1,j) and the center O of the shot figure 50 is defined to be $S_3$. The area ratio of the rectangle whose opposing corners are the reference position of the mesh area of the coordinates (i,j) and the center O of the shot figure 50 is defined to be $S_4$. In this case, the total dose $D_{total}$ of the shot figure 50 can be defined by the following equation (1) using linear interpolation.

$$D_{total}=D(i,j) \cdot S_1+D(i+1,j) \cdot S_2+D(i,j+1) \cdot S_3+D(i+1,j+1) \cdot S_4 \qquad (1)$$

In the beam irradiation dividing number calculation step (S108), the beam irradiation dividing number calculation unit 66 inputs a threshold value $D_{TH}$ of a dose per shot, by which no resist heating, resist evaporation or resist scattering occurs, and a preset SF layer number $N_{SF}$, and calculates, for each shot figure, a beam irradiation dividing number $Div_{SF}$ per SF layer. When it is not divisible by an integer, rounding up is performed. The beam irradiation dividing number $Div_{SF}$ can be defined by the following equation (2).

$$Div_{SF}=\text{ceil}\{D_{total}/(D_{TH} \cdot N_{SF})\} \qquad (2)$$

In the temporary dose calculation step (S110), the temporary dose calculation unit 68 calculates, for each shot figure, a temporary dose $D_{ST}$ for a shot figure concerned per each of the number of times of multiple writing of each of a plurality of stripe areas, by using the number of times of multiple writing per stripe area and the total dose $D_{total}$. Since the number of times of multiple writing for each stripe area is equivalent to the number of stripe layers, which is indicated as $N_{ST}$, the temporary dose calculation unit 68 inputs the stripe layer number $N_{ST}$, and calculates a temporary dose $D_{ST}$ by using the stripe layer number $N_{ST}$ and the total dose $D_{total}$. The temporary dose $D_{ST}$ can be defined by the following equation (3) using the stripe layer number $N_{ST}$ and the total dose $D_{total}$.

$$D_{ST}=D_{total}/N_{ST} \qquad (3)$$

However, the equation (3) is effective when the beam irradiation dividing number $Div_{SF}$ is smaller than or equal to the stripe layer number $N_{ST}$, or when the beam irradiation dividing number $Div_{SF}$ is an integral multiple of the stripe layer number $N_{ST}$.

On the other hand, when the beam irradiation dividing number $Div_{SF}$ is not an integral multiple of the stripe layer number $N_{ST}$ but has an integer remainder $Div_{SF}\% N_{ST}$, though the temporary dose $D_{ST}$ can be obtained by the equation (3), it is more preferable for the temporary dose $D_{ST}$ to be defined by the following equation (4) using a coefficient a for assignment instead of using the equation (3).

$$D_{ST}=(D_{total}/N_{ST})+D_{total} \cdot (a \cdot Div_{SF}\%N_{ST}/Div_{SF}) \qquad (4)$$

If there is no conflict, it may be defined as a=1 for the first stripe layer and as a=0 for the other stripe layers. Alternatively, it is also acceptable to apply the equation (4) when the shot figure concerned is to be shot into an SF near the center of the SF layer, and to apply the equation (3) when the shot figure concerned is to be shot into an SF near the end part of the SF layer. For example, in the case of FIG. 5 where one SF column is composed of six SFs, it is preferable to apply the equation (4) for the shot figures in the third and fourth SFs from the bottom of the column, and apply the equation (3) for the shot figures in the first, second, fifth, and sixth SFs from the bottom of the column.

In the temporary shot data generating step (S111), the assignment processing unit 81 assigns, for each shot figure made by shot division, a figure type (figure code), a position (coordinates), a size, and a temporary dose $D_{ST}$ of the shot figure concerned, and generates temporary shot data. The temporary dose $D_{ST}$ may be defined by an irradiation time obtained by dividing the temporary dose $D_{ST}$ by a current density J. Therefore, at this point, the temporary dose $D_{ST}$ has been defined in the shot data as a suitable dose for the shot figure concerned per stripe layer. When one SF layer is structured for each stripe layer, the temporary dose $D_{ST}$ is defined in the shot data as a suitable dose for the shot figure concerned per SF layer.

In the judgment determination step (S112), the judgment determination unit 70 judges whether each step from S106 to S111 has been completed for all the shot figures in the SF concerned or not. If it has not been completed, it returns to S106 to execute each step from S106 to S111 for a next shot figure which is next to the shot figure for which all the steps from S106 to S111 have been finished. Because each step from S106 to S111 has not been completed with respect to the next shot figure. Until it has been completed with respect to all the shot figures in the SF concerned, each step from S106 to S111 is repeated. When it has been finished for all the shot figures in the SF concerned, it goes to S114.

In the judgment determination step (S114), the judgment determination unit 72 judges whether each step from S106 to S112 has been completed for all the SFs in the SF group (SFG) concerned or not. If it has not been completed, it returns to S106 to execute each step from S106 to S112 for a next SF which is next to the SF for which all the steps from S106 to S112 have been finished. Because each step from S106 to S112 has not been completed with respect to the next SF. Until it has been completed with respect to all the SFs in the SFG concerned, each step from S106 to S112 is repeated. When it has been finished for all the SFs in the SFG concerned, it goes to S202. Here, for example, it is preferable to define each SF column of an SF layer as one SFG. Alternatively, a plurality of adjacent SF columns may be defined as one SFG. Alternatively, a part of one column; that is not the whole of the column, may be defined as one SFG.

In the judgment determination step (S202), the judgment determination unit 74 judges, for each shot figure, whether the dose D which is currently defined in the shot data is less than or equal to the threshold value $D_{TH}$ or not. That is, the judgment determination unit 72 judges whether $D \leq D_{TH}$ or not with respect to each shot figure. For example, in the case of the first judgment determination step (S202), since the dose D defined in the shot data is a temporary dose $D_{ST}$, it is judged with respect to the shot figure concerned whether the temporary dose $D_{ST}$ is less than or equal to the threshold value $D_{TH}$ or not. When it is $D \leq D_{TH}$, it goes to S210. When it is not $D \leq D_{TH}$, it goes to S204.

In the shot dose and residual dose calculation step (S204), in the case of not $D \leq D_{TH}$, the shot dose calculation unit 76 divides the total dose D of the nth and subsequent writing to the shot figure concerned by the threshold value $D_{TH}$, and when it is divisible by an integer, treats the integer as an integer tmp, and when it is not divisible by an integer, obtains an integer tmp by rounding up the numbers after the decimal point. The integer tmp can be defined by the following equation (5).

$$tmp = \text{ceil}(D/D_{TH}) \quad (5)$$

Then, as a dose $D_1$ of the nth writing of each stripe layer (or SF layer), the shot dose calculation unit 76 obtains a value by again dividing the total dose D of the nth and subsequent writing by the calculated integer tmp. The dose $D_1$ can be defined by the following equation (6).

$$D_1 = D/\text{temp} \quad (6)$$

Then, the residual dose calculation unit 78 obtains a value by subtracting the dose $D_1$ of the nth writing from the total dose D of the nth and subsequent writing, as a residual dose $D_2$ of the (n+1)th and subsequent writing for each stripe layer (or each SF layer). The dose $D_2$ can be defined by the following equation (7).

$$D_2 = D - D_1 \quad (7)$$

For example, when not $D \leq D_{TH}$ in the first judgment determination step (S202), the total dose D of the first and subsequent writing to the shot figure concerned per stripe layer (or SF layer) is a temporary dose $D_{ST}$. Therefore, the dose of the first writing to the shot figure concerned can be calculated by using the temporary dose $D_{ST}$. Specifically, when dividing the temporary dose $D_{ST}$ by the threshold value $D_{TH}$, if it is divisible by an integer, the integer is treated as an integer tmp, and when it is not divisible by an integer, an integer tmp is obtained by rounding up the numbers after the decimal point. Concretely, it is calculated by $tmp = \text{ceil}(D_{ST}/D_{TH})$. Then, the shot dose calculation unit 76 obtains a value, as a dose $D_1$ of the first writing per stripe layer (or SF layer), by again dividing the total dose $D_{ST}$ of the first and subsequent writing per stripe layer (or SF layer) by the calculated integer tmp. Specifically, it can be calculated by $D_1 = D_{ST}/\text{temp}$. Therefore, the residual dose $D_2$ of the second and subsequent writing per stripe layer (or SF layer) can be calculated by $D_2 = D - D_1$.

In the copy step (S206), when not $D \leq D_{TH}$ in the judgment determination step (S202), the copy processing unit 80 copies the shot data of the shot figure concerned, and defines it after the shot data for the last SF of the SFG.

Figure 7:
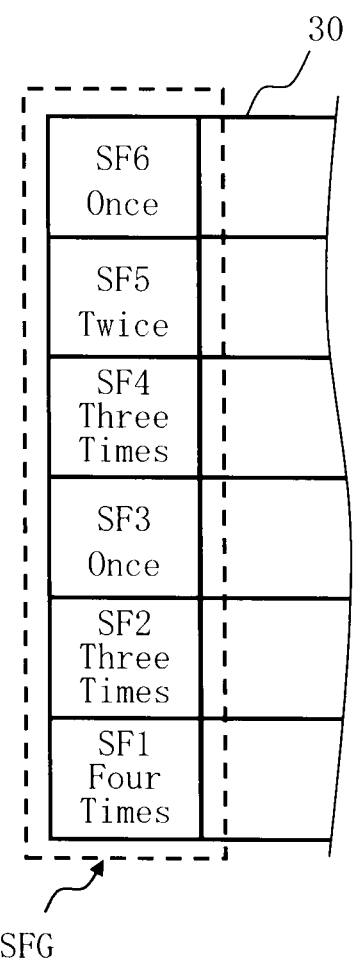
FIG. 7 is a schematic diagram showing an example of the number of times of repetition in an SFG according to Embodiment 1.

FIG. 7 is a schematic diagram showing an example of the number of times of repetition in an SFG according to Embodiment 1. FIG. 7 shows an SF layer for the first writing which is composed of a plurality of SF areas 30 in the stripe area 20 for the first writing. FIG. 7 shows the case where an SFG is structured by one SF column of an SF layer, and, for example, the SFG is composed of SF1, SF2, . . . , and SF6 from the bottom. FIG. 7 shows an example of the number of times to repeatedly write each SF in the SFG of each stripe layer (or each SF layer). FIG. 7 shows an example of the number of times to repeatedly write SFs: four times for SF1, three times for SF2, once for SF3, three times for SF4, twice for SF5, and once for SF6. In other words, it is shown that the SF1 includes a shot figure which needs multiple writing of four times at the maximum for each stripe layer (or each SF layer). Similarly, it is shown that the SF2 includes a shot figure which needs multiple writing of three times at the maximum for each stripe layer (or each SF layer). The SF3 includes only shot figures that need writing of only once for each stripe layer (or each SF layer). The SF4 includes a shot figure which needs multiple writing of three times at the maximum for each stripe layer (or each SF layer). The SF5 includes a shot figure which needs multiple writing of twice at the maximum for each stripe layer (or each SF layer). The SF6 includes only shot figures that need writing of only once for each stripe layer (or each SF layer).

Figure 8:
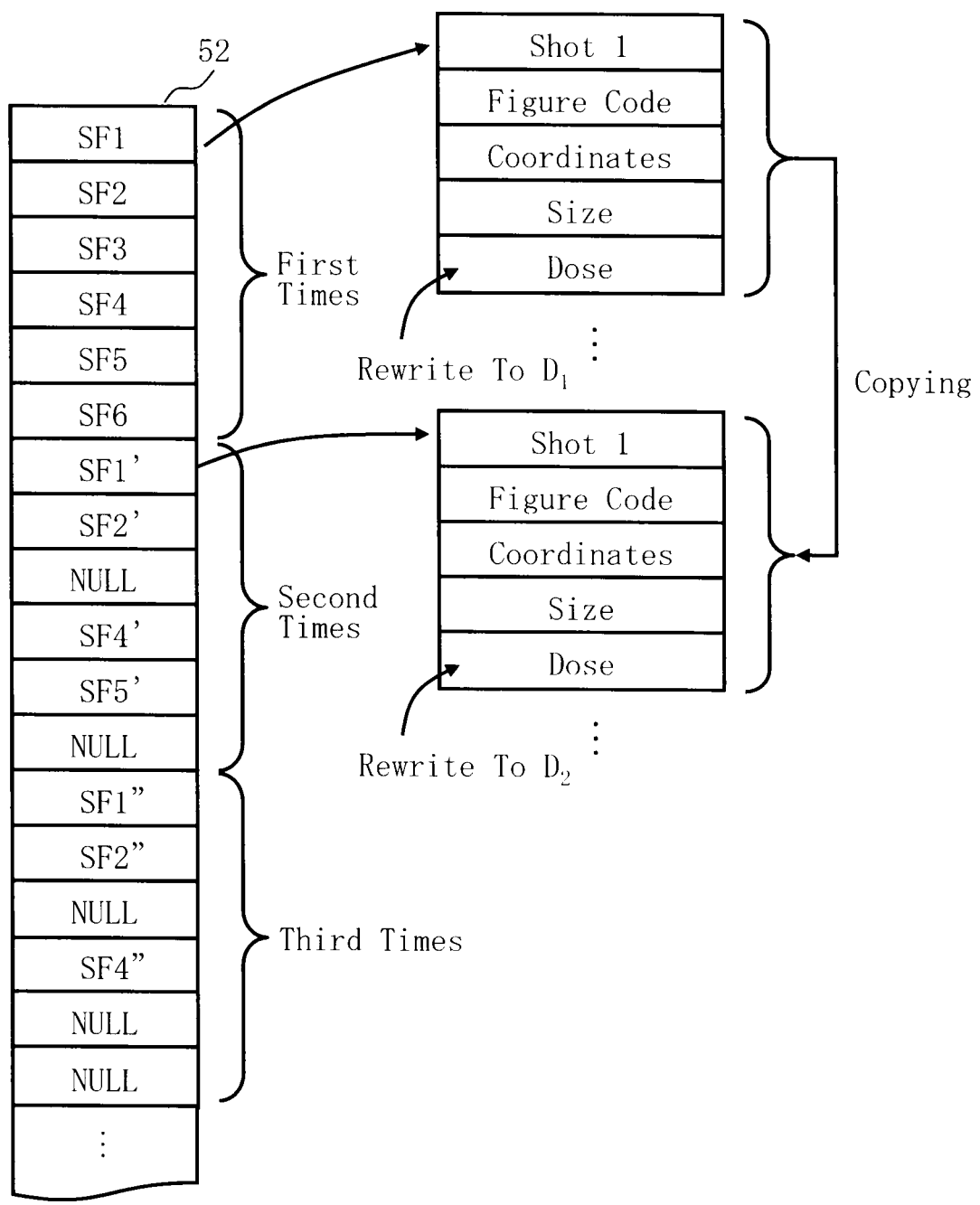
FIG. 8 is a schematic diagram showing an example of shot data according to Embodiment 1.

FIG. 8 is a schematic diagram showing an example of shot data according to Embodiment 1. FIG. 8 illustrates the shot data for SFG shown in FIG. 7. For example, it is preferable for shot data to be generated for each SFG. In shot data 52 of FIG. 8, first, shot data for the first writing per stripe layer (or SF layer) is defined in order for each SF. For each shot figure included in each SF, a shot number, a figure code indicating a figure type, coordinates indicating a shot position, and a shot dose are defined. For example, in the copy step (S206), when shot data of a certain shot figure in the SF1 is copied, shot data (SF1') for the second writing of SF1 is added following the shot data of SF6 at the last of the SFG. The copied shot data of the shot figure of the shot number 1 is added in SF1'.

Similarly, in the copy step (S206), when shot data of a certain shot figure in the SF2 is copied, shot data (SF2') for the second writing of the SF2 is added following the shot data of the SF1 for the second time, namely SF1'. The copied shot data of the shot figure is added in SF2'. On the other hand, since it is sufficient for the shot figure in SF3 to be written once per stripe layer (or SF layer), the shot data is not copied in the copy step (S206). Therefore, NULL data or the shot data of the SF4 (SF4') which comes next may be added following the shot data of the SF2 for the second time, namely SF2'.

In the rewrite step (S208), the rewrite processing unit 82 rewrites the dose D in the shot data of the shot figure of the copy source to $D_1$, and the dose of the copy destination to $D_2$. For example, in the first rewrite step (S208), the dose D in the shot data of the shot figure concerned is a temporary dose $D_{ST}$. Therefore, the temporary dose $D_{ST}$ is rewritten to the calculated $D_1$. Meanwhile, the dose D of the shot data of the shot figure concerned for the second writing, which is newly added by the copying, is also still the temporary dose $D_{ST}$ in the copied state. Therefore, this temporary dose $D_{ST}$ is rewritten to the calculated $D_2$. Other information of the shot data is used as it is.

In the judgment determination step (S210), the judgment determination unit 84 judges whether each step from S202 to S208 has been completed for all the shot figures in the SF concerned or not. If it has not been completed, it returns to S202 to execute each step from S202 to S208 for a next shot figure which is next to the shot figure for which all the steps from S202 to S208 have been finished. Because each step from S202 to S208 has not been completed with respect to the next shot figure. Until it has been completed with respect to all the shot figures in the SF concerned, each step from S202 to S210 is repeated. When it has been finished for all the shot figures in the SF concerned, it goes to S212.

In the judgment determination step (S212), the judgment determination unit 86 judges whether each step from S202 to S210 has been completed for all the SFs in the SF group (SFG) concerned or not. If it has not been completed, it returns to S214 to execute each step from S202 to S210 for a next SF which is next to the SF for which all the steps from S202 to S210 have been finished. Because each step from S202 to S210 has not been completed with respect to the next SF. Until it has been completed with respect to all the SFs in the SFG concerned, each step from S202 to S212 is repeated. When it has been finished for all the SFs in the SFG concerned, it goes to S214.

In the judgment determination step (S214), the judgment determination unit 88 judges whether copied shot data, at least one, exists in SFG or not. When copied shot data, at least one, exists in SFG, it returns to S202 to execute each step from S202 to S212 for the shot figure which was copied in the step S206 of this time. Each step from S202 to S214 is repeated until there exists no copied shot data in the SFG concerned. If there is no copied shot figure, it goes to the next SFG to similarly repeat from S202 to S214.

Figure 9A:
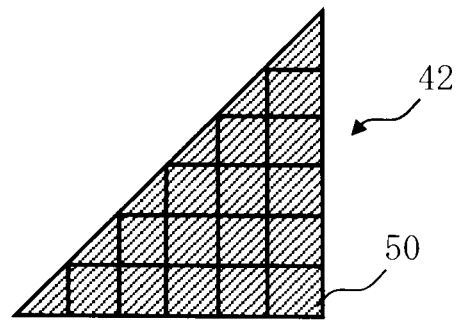
FIGS. 9A to 9D show an example of a figure where multiplicity varies for each shot figure according to Embodiment 1.
Figure 9B:
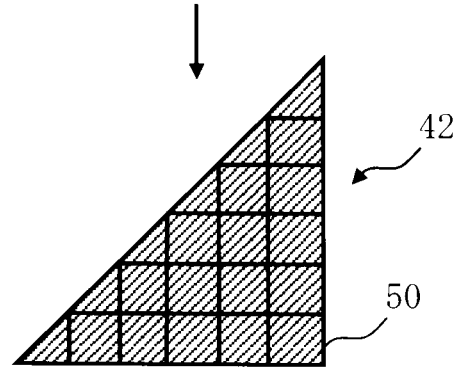

FIGS. 9A to 9D show an example of a figure where multiplicity varies for each shot figure according to Embodiment 1. In FIG. 9A, a figure 42 of a right angled triangle serving as a writing target is divided by shot segmentation into a plurality of shot figures. The first writing needs to be performed for all the shot figures. Therefore, as shown in FIG. 9B, shot data is generated for all the shot figures. Here, with respect to a shot figure 50 located at the right angled corner of the figure 42, for example, in the case of the temporary dose $D_{ST}=250$, if the irradiation threshold value $D_{TH}=100$, since the dose $D=D_{ST}=250$ in the first judgment determination step (S202), consequently $D \leq D_{TH}$ is not satisfied. Thus, $D_1$ and $D_2$ are calculated. Since tmp=3, therefore $D_1=83$ and $D_2=167$. The shot data of the shot figure 50 is copied, and then, the dose of the irradiation source is rewritten to $D_1$ and the dose of the irradiation target is rewritten to $D_2$. Thus, the dose $D=D_1$ of the first writing to the shot figure 50 is calculated by using the temporary dose $D_{ST}$.

Figure 9C:
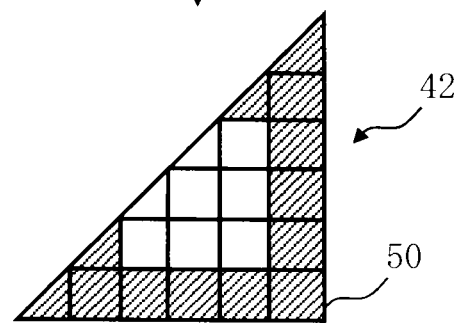

FIG. 9C shows shot figures for which shot data for the second writing is generated. In FIG. 9C, $D \leq D_{TH}$ is satisfied with respect to some shot figures, and thus shot figures where shot data is not copied, shown as blank portions, also exist. The shot figures where copying is not performed is written once (multiplicity=1 for each SF layer) per stripe layer (or SF layer). With respect to the shot figure 50 described above, since the dose D of the first copied shot figure 50 is $D=D_2=167$, $D \leq D_{TH}$ is not satisfied. Then, $D_1$ and $D_2$ are newly calculated. Since tmp=2 this time, it becomes $D_1=83$ and $D_2=84$. The shot data of the shot figure 50 which was copied in the first copy step (S206) is copied, and then, the dose of the irradiation source is rewritten to $D_1$, and the dose of the irradiation target is rewritten to $D_2$.

Figure 9D:
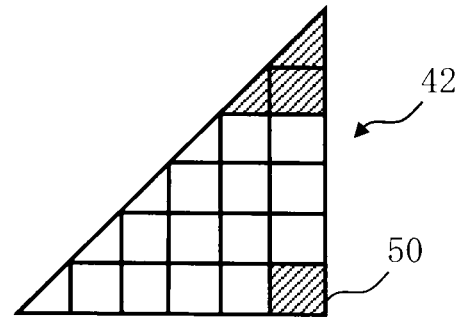

FIG. 9D shows shot figures for which shot data for the third writing is generated. In FIG. 9D, $D \leq D_{TH}$ is satisfied with respect to more shot figures than those of FIG. 9C, and therefore the number of shot figures where shot data is not copied, shown as blank portions, is further increased. Thus, the shot figures where no copying is performed only this time, namely newly added not-copied shot figures, are written twice (multiplicity=2 for each SF layer) per stripe layer (or SF layer). With respect to the shot figure 50 described above, since the dose D of the second copied shot figure 50 is $D=D_2=84$, $D \leq D_{TH}$ is satisfied, and thus, no more copying is performed. Therefore, the dose D of the shot data for the third writing is not rewritten, and thus still $D=D_2=84$. Consequently, the shot figure 50 is written three times (multiplicity=3 for each SF layer) per stripe layer (or SF layer). Now, for example, if the stripe layer number $N_{ST}=2$, the multiplicity N of all the shot figure 50 is 2×3=6.

In the example described above, $D_1$ is calculated using the equations (5) and (6) and $D_2$ is calculated using the equation (7), but it is not limited thereto. For example, as another method, the shot dose calculation unit 76 may obtain, as $D_1$, an integer value of the remainder calculated by dividing the temporary dose $D_{ST}$ by the threshold value $D_{TH}$, as a dose D of the first writing, and may obtain a threshold value $D_{TH}$, as a dose D of each writing of the second and subsequent writing.

Alternatively, it is also preferable for the shot dose calculation unit 76 to continue treating as $D_1=D_{TH}$ as many times of writing as possible, and if a remainder is left finally, the remainder may be treated as $D_1$ at the last writing time.

As described above, the shot data generating unit 79 generates, for each shot figure, each shot data for the number of times of multiple writing of the shot figure concerned such that the multiplicity of the multiple writing is variable per shot figure. The generated shot data is stored in the storage device 142 in order of precedence. By copying shot data in accordance with a residual dose for each shot figure, the multiplicity can be variable for each shot figure. Then, according to the generated shot data, the writing unit 150 overlappingly performs writing of the shot figure concerned onto the target workpiece 101, in accordance with the number of times of multiple writing of each shot data generated for the shot figure concerned, using the electron beam 200.

When writing each shot figure, the writing processing unit 90 controls the deflection control circuit 120 so that the irradiation time may correspond to the dose of each writing time of each shot figure. The writing processing unit 90 starts writing processing by controlling the writing unit 150 through the deflection control circuit 120, etc. Specifically, the writing unit 150 operates as follows: The deflection control circuit 120 inputs shot data from the storage device 142, and outputs a digital signal, which controls the irradiation time for each shot, to the DAC amplifier unit 130. Then, the DAC amplifier unit 130 converts the digital signal into an analog signal and amplifies it to be applied as a deflection voltage to the blanking deflector 212.

When passing through the blanking deflector 212, the electron beam 200 emitted from the electron gun assembly 201 (emission unit) is controlled by the blanking deflector 212 to pass through the blanking aperture 214 when the beam is in the ON state, and is deflected so that the entire beam may be blocked by the blanking aperture 214 when the beam is in the OFF state. The electron beam 200 passing through the blanking aperture 214, while changing the state from beam-OFF to beam-ON and lastly again to beam-OFF, serves as one shot of the electron beam. The blanking deflector 212 controls the direction of the passing electron beam 200 to alternately generate the beam-ON state and the beam-OFF state. For example, it is acceptable to apply a voltage to the blanking deflector 212 when in the beam-OFF state and not to apply a voltage when in the beam-ON state. The dose per shot of the electron beam 200 to irradiate the target workpiece 101 is adjusted depending upon the irradiation time of each shot.

As described above, each shot of the electron beam 200, generated by passing through the blanking deflector 212 and the blanking aperture 214, irradiates the whole of the first shaping aperture 203 which has a quadrangular opening such as a rectangular opening by the illumination lens 202. Here, the electron beam 200 is first shaped to be a quadrangle such as a rectangle. Then, after having passed through the first shaping aperture 203, the electron beam 200 of a first aperture image is projected onto the second shaping aperture 206 by the projection lens 204. The first aperture image on the second shaping aperture 206 is deflection-controlled by the deflector 205 so as to change the shape and size of the beam (variable shaping). Such variable beam shaping is performed for each shot, and, usually, each of the shots is shaped to have a different shape and size. After having passed through the second shaping aperture 206, the electron beam 200 of a second aperture image is focused by the objective lens 207, and deflected by the main deflector 208, and the sub deflector 209 to reach a desired position on the target workpiece 101 placed on the XY stage 105 which moves continuously. As described above, a plurality of shots of the electron beam 200 are deflected in order by a respective deflector onto the target workpiece 101 serving as a substrate.

FIGS. 10A to 10E show an example of a writing order of an SF layer according to Embodiment 1. In the example of FIGS. 10A to 10E, with respect to each stripe area 20, the writing operation is preferably controlled such that writing of the first SF layer and writing of the second SF layer are alternately repeated per SFG composed of a plurality of SF areas arranged in the direction (y direction) perpendicular to the moving direction (x direction) of the XY stage 105.

Figure 10E:
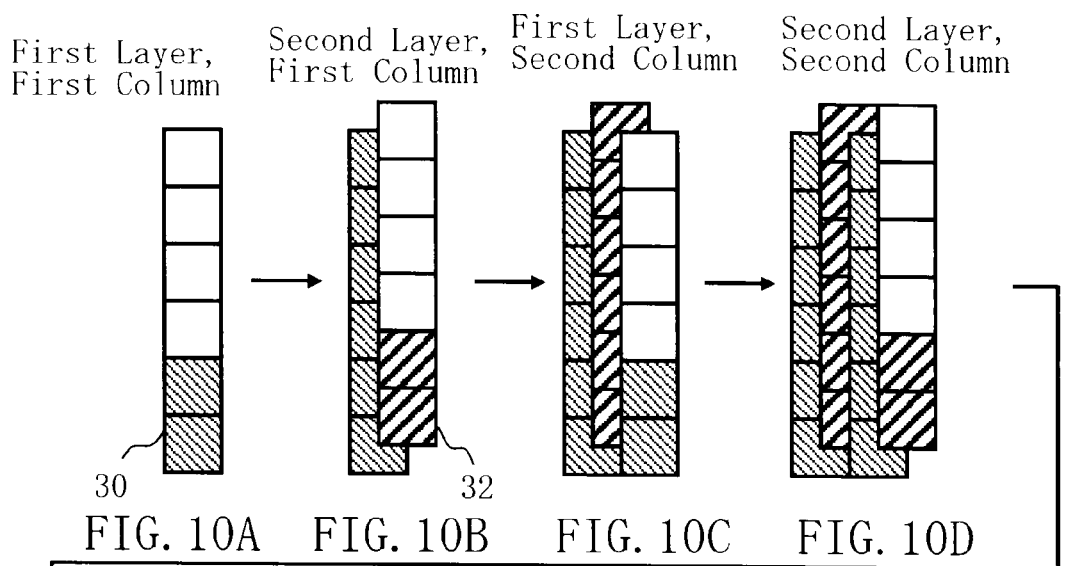
Figure 10E:
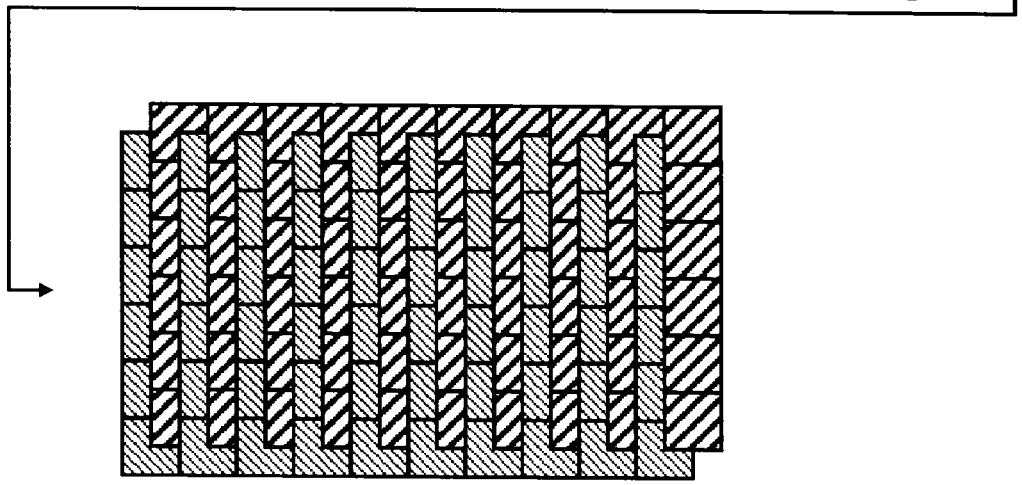

According to the controlling as shown in FIG. 10A, with respect to the first column of the SF layer (the first layer) for the first writing per stripe area, writing is performed starting from the lower left SF area 30 in the y direction in order. After the entire first column of the first SF layer in the target stripe area 20 has been written, next, as shown in FIG. 10B, with respect to the first column of the SF layer (the second layer) for the second writing, writing is performed starting from the lower left SF area 32 in the y direction in order. After the entire first column of the second SF layer in the target stripe area 22 has been written, next, as shown in FIG. 10C, with respect to the second column of the SF layer (the first layer) for the first writing, writing is performed starting from the lower left SF area 30 in the y direction in order. After the entire second column of the first SF layer in the target stripe area 20 has been written, next, as shown in FIG. 10D, with respect to the second column of the SF layer (the second layer) for the second writing, writing is performed starting from the lower left SF area 32 in the y direction in order. Similarly, as shown in FIG. 10E, one stripe area 20 and one stripe area 22 are written by alternately repeating the first writing and the second writing for each stripe area per SF column.

However, it is not limited thereto, and it is also acceptable to write all of the SFs 32 of the second SF layer in the target stripe area 22 after writing all of the SFs 30 of the first SF layer in the target stripe area 20.

Further, in Embodiment 1, when writing each SF layer, the writing is performed repeatedly per SF or per SFG.

Figures 11A, 11B, 11C, 11D:
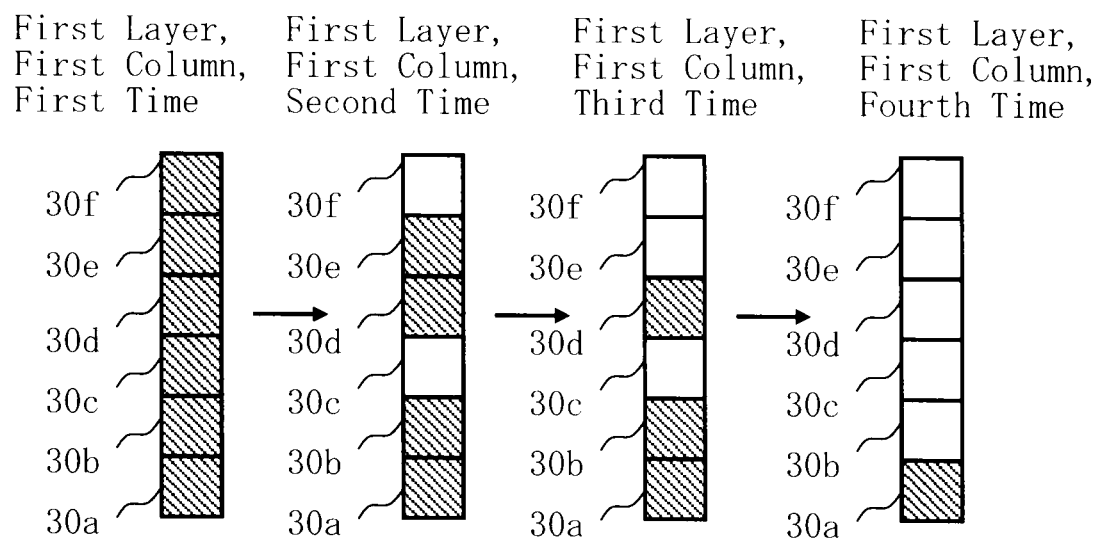
FIGS. 11A to 11D show an example of a writing order of a repeated writing according to Embodiment 1.

FIGS. 11A to 11D show an example of a writing order of a repeated writing according to Embodiment 1. In the example of FIGS. 11A to 11D, with respect to each stripe area 20, the writing operation is repeated the number of times of multiple writing for each stripe layer (or each SF layer) of shot data previously generated per SFG composed of a plurality of SF areas arranged in the direction (y direction) perpendicular to the moving direction (x direction) of the XY stage 105. In this case, the writing is repeated the number of times of multiple writing for each SF in SFG shown in FIG. 7. As shown in FIG. 11A, first, with respect to the first column of the SF layer (the first layer) for the first writing per stripe area, writing is performed starting from the lower left SF area 30a in the y direction to the SF area 30f in order as shown in FIG. 10A. Then, after all the first writing of the first column of the first SF layer in the target stripe area 20 has been performed, next, as shown in FIG. 11B, writing is again performed starting from the lower left SF area 30a in the y direction in order with respect to the first column of the SF layer (the first layer). Here, since copying of shot data is not performed for the SF area 30c equivalent to SF3 and the SF area 30f equivalent to SF6, they are not written, but, the second writing is performed for the other remaining SF areas 30a, 30b, 30d, and 30e. Needless to say, when performing the second writing, only the shot figures for which shot data has been copied for the second writing in each SF are written. Next, as shown in FIG. 11C, with respect to the first column of the SF layer (the first layer), writing is again performed starting from the lower left SF area 30a in the y direction in order. Here, since copying of shot data is not performed for the SF area 30e equivalent to SF5 in addition to for the SF area 30c equivalent to SF3 and the SF area 30f equivalent to SF6, they are not written, but, the third writing is performed for the other remaining SF areas 30a, 30b, and 30d. Needless to say, only the shot figures for which shot data has been copied for the third writing in each SF are written in the third writing. Next, as shown in FIG. 11D, with respect to the first column of the SF layer (the first layer), writing is again performed starting from the lower left SF area 30a in the y direction in order. Here, since copying of shot data is not performed for the SF area 30b equivalent to SF2 and the SF area 30d equivalent to SF4 in addition to for the SF area 30c equivalent to SF3, the SF area 30f equivalent to SF6, and the SF area 30e equivalent to SF5, they are not written, but, the fourth writing is performed for the other remaining SF area 30a. Needless to say, only the shot figure for which shot data has been copied for the fourth writing in the SF area 30a is written in the fourth writing. As described above, each shot figure is repeatedly written per SFG only the number of times needed.

In the above example, there has been described a structure in which the first writing and the second writing per stripe area are alternately repeated while regarding SFs, which configure one SF column, as an SFG, but it is not limited thereto.

FIGS. 12A to 12G show another example of a writing order of an SF layer according to Embodiment 1. In the example of FIG. 12A to FIG. 12G, with respect to each stripe, while regarding, as an SFG, an SF area group composed of a plurality of SF columns each having a plurality of SF areas arranged in the direction (y direction) perpendicular to the moving direction (x direction) of the XY stage 105, the writing operation is controlled such that writing of the first SF layer and writing of the second SF layer are alternately repeated per unit of the SFG.

Figures 12A, 12B, 12C, 12D:
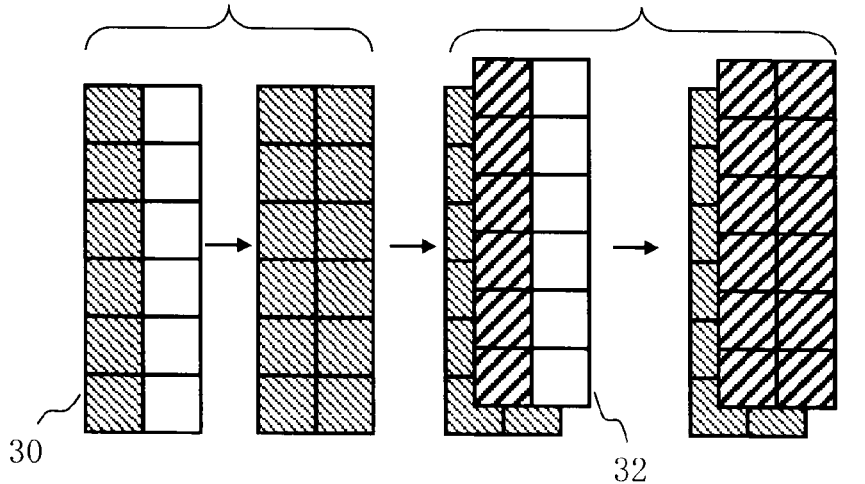
FIGS. 12A to 12G show another example of a writing order of an SF layer according to Embodiment 1.
Figures 12E, 12F:
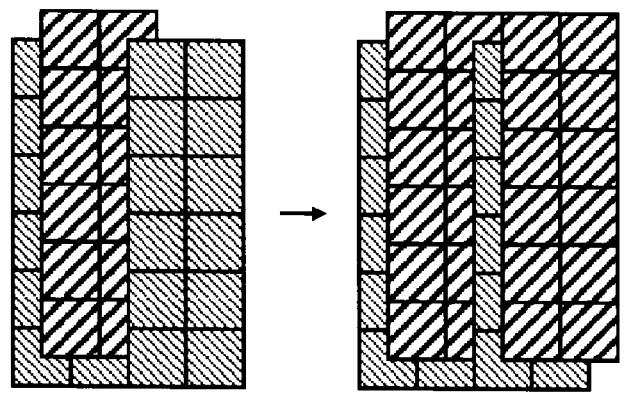

According to the controlling as shown in FIG. 12A, first, with respect to the first column of the SF layer (the first layer) for the first writing per stripe area, writing is performed starting from the lower left SF area 30 in the y direction in order, and next, with respect to the second column, writing is performed starting from the lower left SF area 30 in the y direction in order. After the entire first and second columns of the first SF layer in the target stripe area 20 have been written as shown in FIG. 12B, next, as shown in FIG. 12C, with respect to the first column of the SF layer (the second layer) for the second writing per stripe area, writing is performed starting from the lower left SF area 32 in the y direction in order, and next, with respect to the second column, writing is performed starting from the lower left SF area 32 in the y direction in order. Then, after the entire first and second columns of the second SF layer in the target stripe area 22 have been written as shown in FIG. 12D, next, as shown in FIG. 12E, writing is similarly performed with respect to the third and fourth columns of the SF layer (the first layer) for the first writing per stripe area. After the entire third and fourth columns of the first SF layer in the target stripe area 20 have been written, next, as shown in FIG. 12F, writing is similarly performed with respect to the third and fourth columns of the SF layer (the second layer) for the second writing per stripe area.

Figure 12G:
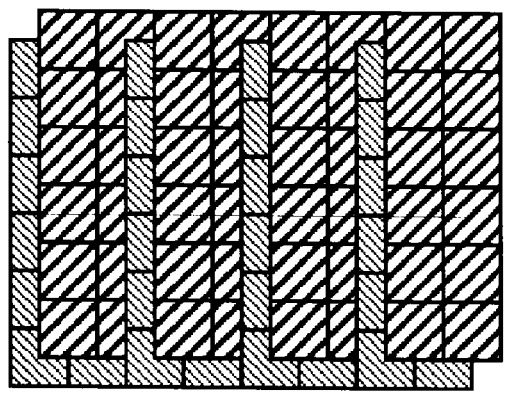

Similarly, regarding two SF columns as an SFG, one stripe area 20 and one stripe area 22 are written as shown in FIG. 12G by alternately repeating the first writing and the second writing for each stripe area per unit of SFG.

In the example of FIGS. 12A to 12G, two SF columns are treated as an SFG where the first writing and the second writing are alternately repeated for each stripe area. However, it is also acceptable to treat three or more SF columns as an SFG as long as being within the deflectable range of the main deflector 208.

Figure 13A:
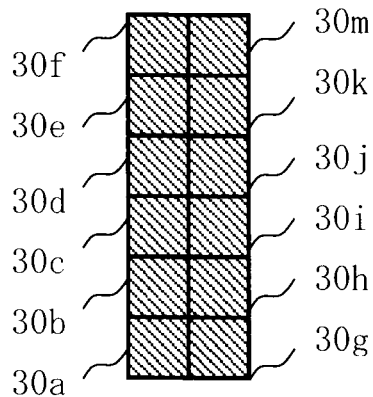
FIGS. 13A to 13D show another example of a writing order of a repeated writing according to Embodiment 1.
Figure 13B:
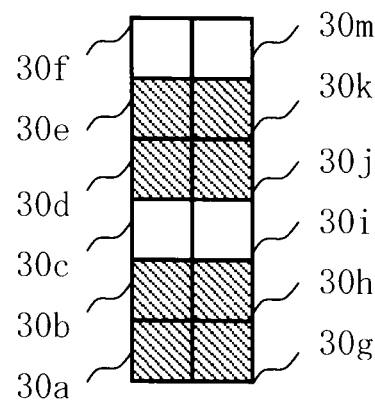
Figure 13C:
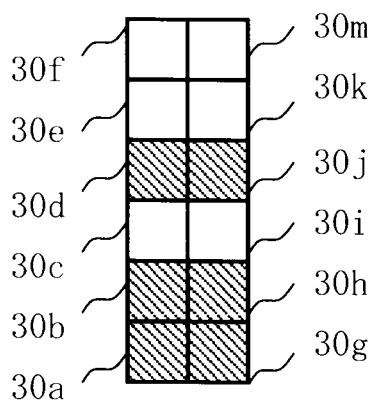
Figure 13D:
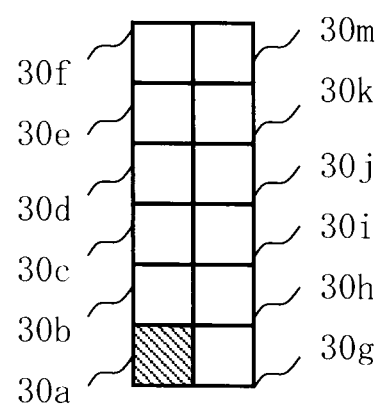
Figure 14:
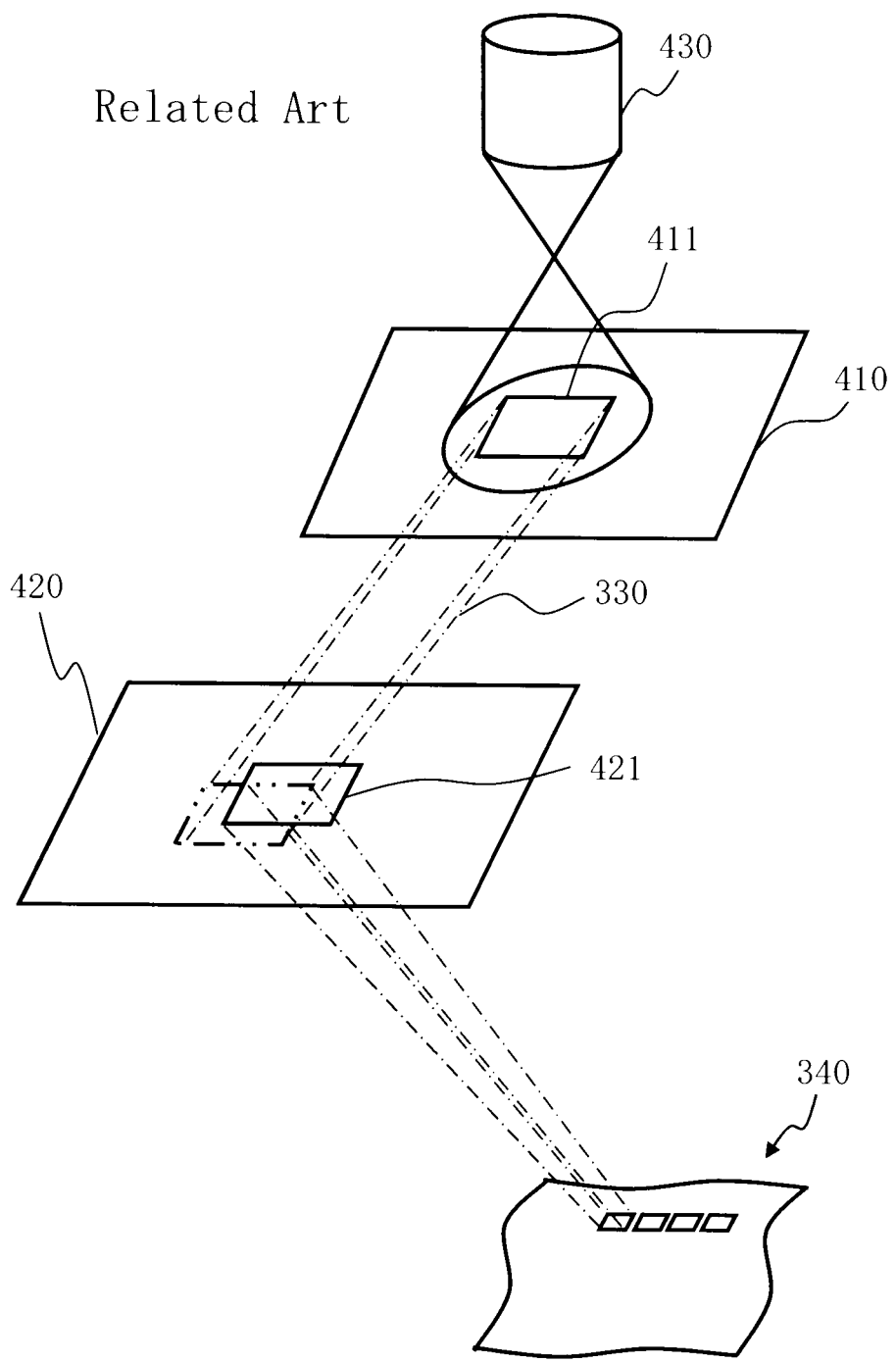
FIG. 14 is a schematic diagram for explaining operations of a variable-shaped electron beam writing apparatus.

FIGS. 13A to 13D show another example of a writing order of a repeated writing according to Embodiment 1. In the example of FIGS. 13D to 13A, with respect to each stripe area 20, the writing operation is repeated the number of times of multiple writing for each stripe layer (or each SF layer) of shot data previously generated per SFG composed of a plurality of SF columns. As shown in FIG. 13A, first, with respect to the first and second columns of the SF layer (the first layer) for the first writing per stripe area, writing is performed starting from the lower left SF area 30a to the SF area 30f in the y direction in order, and next, from the SF area 30g to the SF area 30m in the y direction in order. Then, after all the first writing of the first and second columns of the first SF layer in the target stripe area 20 has been performed, next, as shown in FIG. 13B, with respect to the first and second columns of the SF layer (the first layer), writing is again performed starting from the lower left SF area 30a in the y direction in order. Here, since copying of shot data is not performed for the SF areas 30c and 30f equivalent to SF3 and SF6 of the SF first column, and the SF areas 30c and 30f equivalent to SF3 and SF6 of the SF second column, they are not written, but, the second writing is performed for the other remaining SF areas 30a, 30b, 30d, 30e, 30g, 30h, 30j, and 30k. Needless to say, when performing the second writing, only the shot figures for which shot data has been copied for the second writing in each SF are written. Next, as shown in FIG. 13C, with respect to the first and second columns of the SF layer (the first layer), writing is again performed starting from the lower left SF area 30a in the y direction in order. Here, further, since copying of shot data is not performed for the SF area 30e equivalent to SF5 of the first column and the SF area 30k equivalent to SF5 of the second column, they are not written, but, the third writing is performed for the other remaining SF areas 30a, 30b, 30d, 30g, 30h, and 30j. Needless to say, when performing the third writing, only the shot figures for which shot data has been copied for the third writing in each SF are written. Next, as shown in FIG. 13D, with respect to the first column of the SF layer (the first layer), writing is again performed starting from the lower left SF area 30a in the y direction in order. Here, further, since copying of shot data is not performed for the SF areas 30b and 30d equivalent to SF2 and SF4 of the SF first column and the SF areas 30g, 30h, and 30j equivalent to SF1, Sf2, and SF4 of the second column, they are not written, but the fourth writing is performed for the other remaining SF area 30a. Needless to say, when performing the fourth writing, only the shot figure for which shot data has been copied for the fourth writing in the SF area 30a is written. As described above, each shot figure is repeatedly written per SFG only the number of times needed.

As described above, according to Embodiment 1, since the multiplicity of multiple writing of each shot figure is variable, it is possible to avoid performing too many times multiple writing than needed for a shot figure. Therefore, excessive shots are not performed, thereby shortening the writing time. Thus, the writing time in multiple writing can be reduced.

Referring to specific examples, Embodiments have been described above. However, the present invention is not limited to these examples. For example, in the example described above, one SF layer is structured per stripe area of one stripe layer, but it is not limited thereto. It is also acceptable to structure a plurality of SF layers per stripe area of one stripe layer. In such a case, a temporary dose $D_{ST}$ may be obtained by the following equation (8) instead of the equation (3), using an SF layer number $N_{SF}$ for each stripe area of one stripe layer.

$$D_{ST}=D_{total}/(N_{ST} N_{SF}) \qquad (8)$$

By this equation (8), a temporary dose $D_{ST}$ necessary for a shot figure per SF layer can be calculated. Similarly, the following equation (9) can be used instead of the equation (4).

$$D_{ST}=\{D_{total}/(N_{ST} N_{SF})\}+D_{total}\cdot(a\cdot \mathrm{Div}_{SF}\%N_{ST}/\mathrm{Div}_{SF}) \qquad (9)$$

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a shot division unit configured to divide a figure defined in layout data into a plurality of shot figures each having a size which can be irradiated by one shot of a charged particle beam;
a shot data generating unit configured to generate each shot data for each shot figure of the plurality of shot figures, where a number of times of generating the each shot data is equivalent to a number of times of multiple writing of the each shot figure of the plurality of shot figures, such that multiplicity of the multiple writing is variable per the each shot figure;
a storage unit configured to store a dose map;
a total dose calculation unit configured to read the dose map and calculate, for the each shot figure, a total dose used when performing the multiple writing of the each shot figure;
a temporary dose calculation unit configured to calculate a temporary dose for the each shot figure per each of a number of times of multiple writing of each of a plurality of stripe areas made by virtually dividing a writing area of the target workpiece into strip-like areas each having a predetermined width, by using the total dose and the number of times of the multiple writing of the each of the plurality of stripe areas;
a dose calculation unit configured to compare the calculated temporary dose with a threshold value of a dose per shot indicating a maximum dose that avoids resist heating, resist evaporation, or resist scattering, (1) and in a case the calculated temporary dose is not less than the threshold value, the calculated temporary dose is divided by the threshold value to obtain an integer rounding up from a result of the division, to calculate an actual dose per shot figure by dividing the calculated temporary dose by the integer, (2) and in a case the calculated temporary dose is less than the threshold value, to use the calculated temporary dose as the actual dose per shot figure; and
a writing unit configured to perform the multiple writing of the each shot figure onto a target workpiece, in accordance with the calculated actual dose and the number of times of the each shot data generated for the each shot figure, using a charged particle beam.

2. A charged particle beam writing method comprising:
dividing a figure defined in layout data into a plurality of shot figures each having a size which can be irradiated by one shot of a charged particle beam;
generating each shot data for each shot figure of the plurality of shot figures, where a number of times of generating the each shot data is equivalent to a number of times of multiple writing of the each shot figure of the plurality of shot figures, such that multiplicity of the multiple writing is variable per the each shot figure;
storing a dose map;
reading the dose map and calculating, for the each shot figure, a total dose used when performing the multiple writing of the each shot figure;
calculating a temporary dose for the each shot figure per each of a number of times of multiple writing of each of a plurality of stripe areas made by virtually dividing a writing area of the target workpiece into strip-like areas each having a predetermined width, by using the total dose and the number of times of the multiple writing of the each of the plurality of stripe areas;
comparing the calculated temporary dose with a threshold value of a dose per shot indicating a maximum dose that avoids resist heating, resist evaporation, or resist scattering, (1) and in a case the calculated temporary dose is not less than the threshold value, the calculated temporary dose is divided by the threshold value to obtain an integer rounding up from a result of the division, calculating an actual dose per shot figure by dividing the calculated temporary dose by the integer, (2) and in a case the calculated temporary dose is less than the threshold value, using the calculated temporary dose as the actual dose per shot figure; and
performing the multiple writing of the each shot figure onto a target workpiece, in accordance with the calculated actual dose and the number of times of the each shot data generated for the each shot figure, using a charged particle beam.

3. A charged particle beam writing apparatus comprising:
a shot division means for dividing a figure defined in layout data into a plurality of shot figures each having a size which can be irradiated by one shot of a charged particle beam;
a shot data generating means for generating each shot data for each shot figure of the plurality of shot figures, where a number of times of generating the each shot data is equivalent to a number of times of multiple writing of the each shot figure of the plurality of shot figures, such that multiplicity of the multiple writing is variable per the each shot figure;
a storage means for storing a dose map;
a total dose calculation means for reading the dose map and calculating, for the each shot figure, a total dose used when performing the multiple writing of the each shot figure;
a temporary dose calculation means for calculating a temporary dose for the each shot figure per each of a number of times of multiple writing of each of a plurality of stripe areas made by virtually dividing a writing area of the target workpiece into strip-like areas each having a predetermined width, by using the total dose and the number of times of the multiple writing of the each of the plurality of stripe areas;
a dose calculation means for comparing the calculated temporary dose with a threshold value of a dose per shot indicating a maximum dose that avoids resist heating, resist evaporation, or resist scattering, (1) and in a case the calculated temporary dose is not less than the threshold value, the calculated temporary dose is divided by the threshold value to obtain an integer rounding up from a result of the division, for calculating an actual dose per shot figure by dividing the calculated temporary dose by the integer, (2) and in a case the calculated temporary dose is less than the threshold value, using the calculated temporary dose as the actual dose per shot figure; and
a writing means for performing the multiple writing of the each shot figure onto a target workpiece, in accordance with the calculated actual dose and the number of times of the each shot data generated for the each shot figure, using a charged particle beam, wherein multiplicity of the multiple writing using a same shot data and superposed on a same position for the each shot figure is dynamically controlled such that a dose per one shot does not become greater than the threshold value.

4. A charged particle beam writing apparatus comprising:

a shot division unit configured to divide a figure defined in layout data into a plurality of shot figures each having a size which can be irradiated by one shot of a charged particle beam; and a writing unit configured to write the plurality of shot figures each in which a different dose depending on a position of a shot figure is defined, onto a target workpiece with charged particle beams of a plurality of shots, for each of the plurality of shot figures, obtained by dividing a shot of a beam per one pass in multiple writing of multiplicity set in advance such that a dose per one shot does not become greater than a threshold value, wherein multiplicity of the multiple writing using a same shot data and superposed on a same position for the each of the plurality of shot figures is dynamically controlled such that a dose per one shot does not become greater than the threshold value.

5. The apparatus according to claim 4 further comprising:

a judgment determination unit configured to judge, for the each shot figure, whether the dose per one shot is less than or equal to the threshold value.

6. The apparatus according to claim 5 further comprising:

a calculation unit configured to calculate, for the each shot figure, a number of divisions to divide the shot of the beam per the one pass into the plurality of shots.

7. The apparatus according to claim 6, wherein the calculation unit calculates, for the each shot figure, a dose of each of the plurality of the shots divided, in order.

8. The apparatus according to claim 7, wherein the division of the plurality of shots is performed by repeating writing of a first plurality of subfields (SFs) made by virtually dividing a writing area into mesh like areas or writing of a SF group composed of a second plurality of SFs of the first plurality of SFs.

\* \* \* \* \*